(12) United States Patent
Suzuki

(10) Patent No.: US 9,970,990 B2
(45) Date of Patent: May 15, 2018

(54) SEMICONDUCTOR DEVICE AND BATTERY MONITORING SYSTEM

(71) Applicant: LAPIS SEMICONDUCTOR CO., LTD., Yokohama (JP)

(72) Inventor: Koji Suzuki, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 492 days.

(21) Appl. No.: 13/802,589

(22) Filed: Mar. 13, 2013

(65) Prior Publication Data

US 2013/0257443 A1     Oct. 3, 2013

(30) Foreign Application Priority Data

Mar. 28, 2012   (JP) .................. 2012-073564

(51) Int. Cl.
*H02J 7/00*    (2006.01)
*G01R 31/36*   (2006.01)

(52) U.S. Cl.
CPC ....... *G01R 31/362* (2013.01); *G01R 31/3658* (2013.01)

(58) Field of Classification Search
CPC .... H01M 10/441; H02J 7/0016; H02J 7/0021; H02J 7/0024

(Continued)

(56) References Cited

U.S. PATENT DOCUMENTS

| 6,255,826 B1 | 7/2001 | Ohsawa et al. | |
| 2008/0012570 A1* | 1/2008 | Bucur | H01M 8/04552 324/426 |

(Continued)

FOREIGN PATENT DOCUMENTS

| JP | 08205534 A | * | 8/1996 |
| JP | H08-205534 A | | 8/1996 |
| JP | 2001-116776 A | | 4/2001 |
| JP | 2005-134154 A | | 5/2005 |
| JP | 2008-205534 A | | 9/2008 |
| JP | 2010-281805 A | | 12/2010 |

OTHER PUBLICATIONS

An Office Action; "Notice of Reasons for Rejection," issued by the Japanese Patent Office dated Feb. 23, 2016, which corresponds to Japanese Patent Application No. 2012-073564 and is related to U.S. Appl. No. 13/802,589; with English language translation.

(Continued)

*Primary Examiner* — Drew A Dunn
*Assistant Examiner* — Zixuan Zhou
(74) *Attorney, Agent, or Firm* — Studebaker & Brackett PC

(57) ABSTRACT

A semiconductor device including: lines connected to lines between respective neighboring battery cells of plural battery cells connected in series; at each of the battery cells, a voltage detection portion that detects a battery voltage value of the battery cell based on a voltage provided by the lines connected to the high potential side of the battery cell and to the low potential side of the battery cell; and at each of the lines, a regulation portion that regulates current to make a first current and a second current cancel out, the first current being caused to flow in a first direction in the resistor element by the battery cell at the high potential side of the line, and the second current being caused to flow in a second direction in the resistor element by the battery cell at the low potential side of the line.

6 Claims, 8 Drawing Sheets

(58) Field of Classification Search
USPC .......................... 324/426, 433; 320/116–119
See application file for complete search history.

(56) References Cited

U.S. PATENT DOCUMENTS

| | | | |
|---|---|---|---|
| 2008/0164881 A1* | 7/2008 | Miyamoto | G01R 15/04 324/429 |
| 2008/0199090 A1 | 8/2008 | Tasaka et al. | |
| 2009/0130542 A1* | 5/2009 | Mizoguchi | H01M 10/4207 429/61 |
| 2010/0239896 A1* | 9/2010 | Kanno | H01M 10/482 429/92 |
| 2013/0026994 A1* | 1/2013 | Morikawa | G01R 31/3658 320/134 |

OTHER PUBLICATIONS

An Office Action; "Notification of the First Office Action," issued by the State Intellectual Property Office of People's Republic of China dated Nov. 29, 2016, which corresponds to Chinese Patent Application No. 201310072381.X and is related to U.S. Appl. No. 13/802,589; with English language translation.

* cited by examiner

SEMICONDUCTOR DEVICE AND BATTERY MONITORING SYSTEM

CROSS-REFERENCE TO RELATED APPLICATION

This application is based on and claims priority under 35 USC 119 from Japanese Patent Application No. 2012-073564 filed on Mar. 28, 2012, the disclosure of which is incorporated by reference herein.

BACKGROUND

Technical Field

The present invention relates to a semiconductor device and a battery monitoring system, and particularly relates to a semiconductor device and battery monitoring system that detect voltages of battery cells.

Related Art

In general, a battery pack (assembled battery) in which plural batteries (battery cells) are connected in series is used as a high-power battery with high capacity to be utilized for driving a motor in a hybrid automobile or an electric automobile, or the like (as a concrete example, a lithium ion battery or the like can be mentioned). A battery monitoring system that detects and monitors voltages of the battery cells of this battery with voltage detection circuits is known. As an example of this kind of voltage detection circuit, the technology recited in Japanese Patent Application Laid-Open (JP-A) No. 2010-281805 is known.

Another technology is recited in JP-A No. 2001-116776, in which a noise removal filter that removes noise produced by a battery cell is provided between the battery cell and a voltage detection circuit.

An example of a related art battery monitoring system and voltage detection circuit is shown in FIG. 6 and FIG. 7. Here, as a specific example, three battery cells C of a battery cell group 12 are illustrated in FIG. 6. As shown in FIG. 7, a voltage detection circuit 200 of a related art battery monitoring system 100 is provided at each battery cell C.

The voltage detection circuit 200 divides a battery voltage from the battery cell C (a difference between a high potential side voltage and a low potential side voltage of the battery cell) over a resistor Ra and a resistor Rb, and is equipped with a comparison circuit (a comparator 300) that compares the divided voltage with a reference voltage generated by a reference voltage generation circuit, and outputs a comparison result.

If the battery voltages of neighboring battery cells C are different, the related art battery monitoring system 100 as shown in FIG. 6 may not be able to accurately detect the battery voltages of the battery cells C, due to the effect of a noise removal filter 14 connected between the battery cell group 12 and the voltage detection circuits 200.

Operation of the related art voltage detection circuit 200 is described with reference to FIG. 8. As shown in FIG. 8, a current flowing in a battery cell C1 is represented by I1, and an input voltage of the voltage detection circuit 200 thereof is represented by V1. Similarly, a current flowing in a battery cell C2 is represented by I2 and the input voltage of the voltage detection circuit 200 thereof is represented by V2, and a current flowing in a battery cell C3 is represented by I3 and the input voltage of the voltage detection circuit 200 thereof is represented by V3.

The noise removal filter 14 is a low-pass filter (LPF) constituted by an RC circuit. Resistors to which the same reference numeral is assigned in the RC circuits have equal resistance values.

Firstly, a case in which the battery voltages of neighboring battery cells C are equal is described. Specifically, a state in which the battery voltages of the battery cells C (C1, C2 and C3) of the battery cell group 12 are all equal is described.

Of current flowing in a resistor R1 of the noise removal filter 14, a current flowing from a low potential side (lower level) battery cell C and a current flowing from a high potential side (upper level) battery cell C flow in opposite directions. Given that the battery voltages of these battery cells C are equal, the values of the two currents are equal, the currents flowing in the resistor R1 cancel out, and there is no voltage drop across the resistor R1. Therefore, when the battery voltages of the battery cells C are equal, the battery voltage of each battery cell C becomes the input voltage V of the voltage detection circuit 200 thereof, and there are no differences between the input voltages V.

In a resistor R2 that is connected to the highest potential battery cell C3, current flows in only one direction (corresponding to a current flowing from the low potential side battery cell). Therefore, there is a voltage drop across the resistor R2, and there may be a difference between the battery voltage of the highest potential battery cell C3 and the input voltage V of the voltage detection circuit 200 thereof Reducing the resistance value of resistor R2 is commonly used as a measure to moderate the effects of this difference.

Next, a case in which the battery voltages of neighboring battery cells C are not equal is described. As a specific example, a case in which the battery voltage of the battery cell C1 is smaller than those of the other battery cells C (C2 and C3) is described. In this case, the current I1 is not equal to the current I2.

A current that flows in the resistor R1 of the noise removal filter 14 that is connected between the battery cell C1 and the battery cell C2 is the difference between current I1 and current I2. Given that the battery cell C2 has a larger battery voltage than the battery cell C1, current I2 is larger than current I1. Therefore, the current flowing through the resistor R1 is not substantially at zero, and a voltage drop is caused by the current difference between current I1 and current I2. Therefore, there are differences between the input voltages V of the voltage detection circuits 200 and the battery voltages of the battery cells C, and accurate voltage detections may not be possible.

SUMMARY

The present invention is proposed to solve the problem described above, and an object of the present invention is to provide a semiconductor device and battery monitoring system that may accurately detect battery voltages of battery cells regardless of variations in the battery voltages.

A first aspect of the present invention provides a semiconductor device including:

plural lines connected, each via a resistor element, to lines between respective neighboring battery cells of plural battery cells connected in series;

at each of the plural battery cells, a voltage detection portion that detects a battery voltage value of the battery cell in accordance with a voltage provided by the line that is connected to the high potential side of the battery cell and the line that is connected to the low potential side of the battery cell; and at each of the plural lines, a regulation portion that regulates current to make a first current and a second current cancel out, the first current being caused to flow in a first direction in the resistor element by the battery cell at the high potential side of the line, and the second current being caused to flow in a second direction in the resistor element by the battery cell at the low potential side of the line.

A second aspect of the present invention provides a battery monitoring system including:

plural battery cells connected in series;

a noise removal portion comprising resistor elements and capacitor elements connected to high potential sides of the plural battery cells;

plural lines connected, via the resistor elements of the noise removal portion, to lines between respective neighboring battery cells of the plural battery cells;

at each of the plural battery cells, a voltage detection portion capable of detecting a battery voltage value of the battery cell in accordance with a voltage provided by the line that is connected to the high potential side of the battery cell and the line that is connected to the low potential side of the battery cell; and at each of the plural lines, a regulation portion configured to regulate current to make a first current and a second current cancel out, the first current being caused to flow in a first direction in the resistor element by the battery cell at the high potential side of the line, and the second current being caused to flow in a second direction in the resistor element by the battery cell at the low potential side of the line.

According to the present invention, an effect is provided in that battery voltages of battery cells may be accurately detected regardless of variations in the battery voltages.

BRIEF DESCRIPTION OF THE DRAWINGS

Exemplary embodiments of the present invention will be described in detail based on the following figures, wherein.

DETAILED DESCRIPTION

—First Exemplary Embodiment—

Herebelow, a voltage detection circuit and battery monitoring system according to the first exemplary embodiment are described in detail with reference to the drawings. The battery monitoring system detects voltages of battery cells with the voltage detection circuit.

Figure 1:
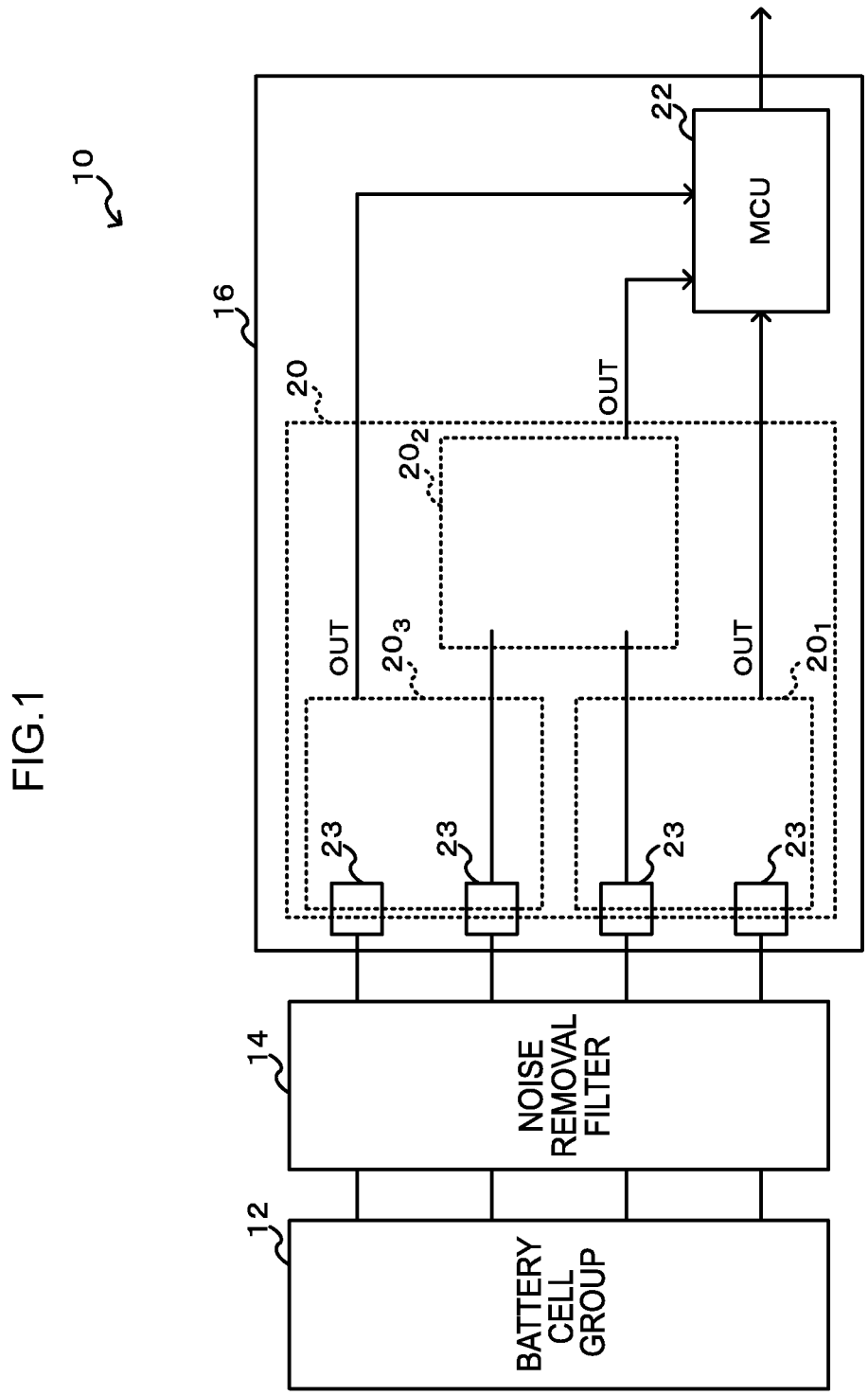
FIG. 1 is a circuit diagram showing an example of schematic structure of a battery monitoring system in accordance with a first exemplary embodiment.

First, structure of the battery monitoring system according to the present exemplary embodiment is described. FIG. 1 shows an example of schematic structure of the battery monitoring system of the present exemplary embodiment. A battery monitoring system 10 of the present exemplary embodiment that is shown in FIG. 1 is provided with the battery cell group 12 including a plural number of battery cells C (in the present exemplary embodiment, three battery cells C are illustrated in the battery cell group 12), the noise removal filter 14, and a semiconductor device 16 equipped with voltage detection circuits 20 that detect battery voltages of the battery cells of the battery cell group 12.

The semiconductor device 16 is provided with the voltage detection circuits 20 and a microcontroller unit (MCU) 22. The high potential sides and low potential sides of the battery cells C (C1, C2 and C3) of the battery cell group 12 are connected with respective voltage detection circuits $20_1$, $20_2$ and $20_3$ via terminals (pads) 23 (see FIG. 2).

The MCU 22 is structured with a CPU and memory such as ROM, RAM and the like. The MCU 22 functions to perform pre-specified processing in accordance with whether or not outputs OUT that are outputted from the respective voltage detection circuits 20 ($20_1$, $20_2$ and $20_3$) are at predetermined potentials.

Figure 2:
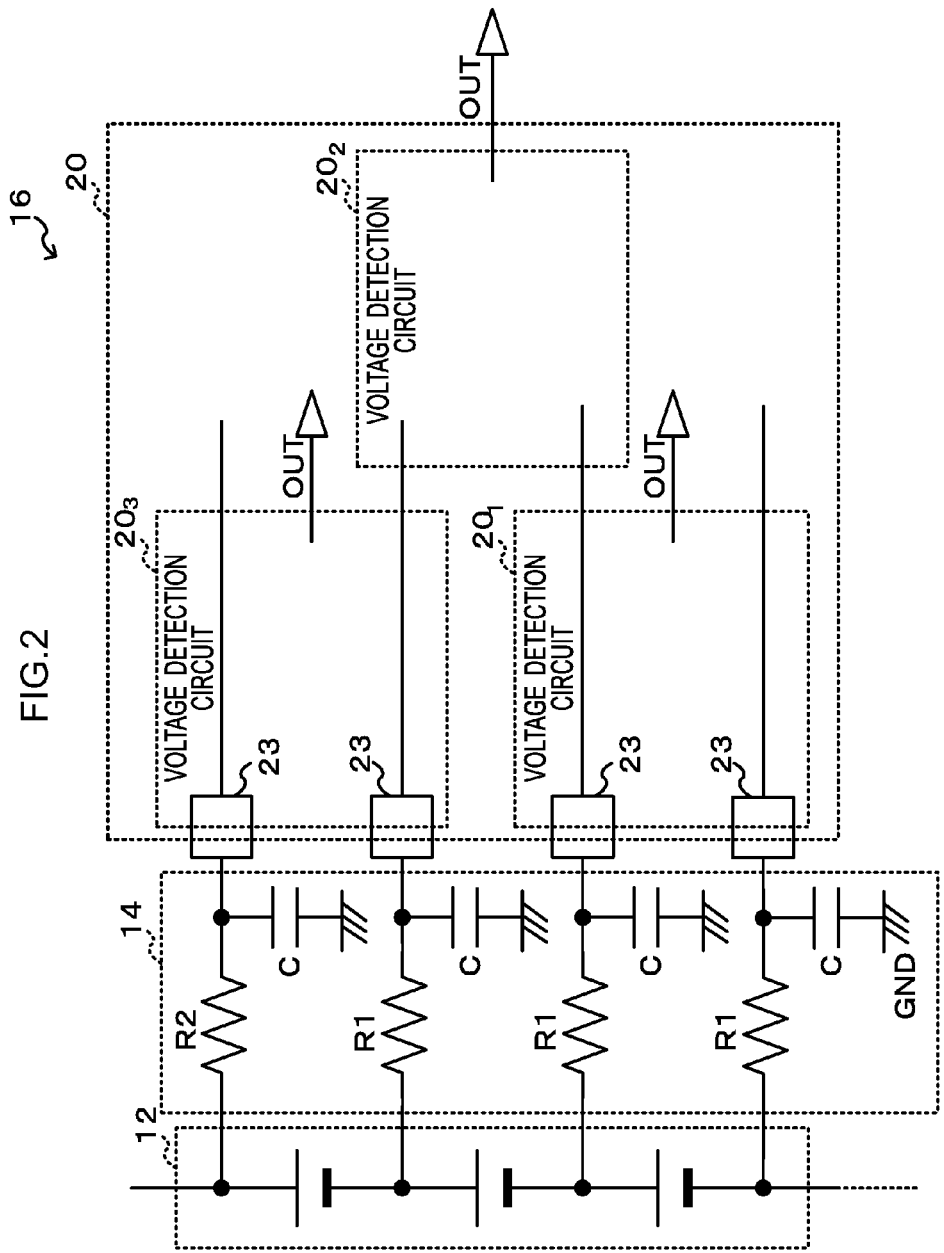
FIG. 2 is a schematic diagram showing relationships between voltage detection circuits and a battery cell group in accordance with the first exemplary embodiment.

In the present exemplary embodiment, the voltage detection circuits $20_1$, $20_2$ and $20_3$ are provided for each of the battery cells C (C1, C2 C3). Relationships between the voltage detection circuits $20_1$, $20_2$ and $20_3$ of the present exemplary embodiment and the battery cell group 12 are shown in FIG. 2. Hereinafter, where the voltage detection circuits $20_1$, $20_2$ and $20_3$ are to be individually referred to, individually identified reference numerals are given, and where the voltage detection circuits $20_1$, $20_2$ and $20_3$ are to be referred to in general, they are simply referred to as the voltage detection circuits 20.

The noise removal filter 14 is connected between the battery cell group 12 and the voltage detection circuits 20 (the semiconductor device 16). The noise removal filter 14 is a low-pass filter (LPF) constituted by RC circuits. The noise removal filter 14 functions to suppress sudden voltage changes occurring in the battery cells C, by cutting out high-frequency components. The resistors of the RC circuits of the noise removal filter 14 are a resistor R2 that is connected only at the high potential side of the highest potential battery cell C (C3), and resistors R1 in the other RC circuits (described in more detail herebelow). R2 has a smaller resistance value than R1.

Figure 3:
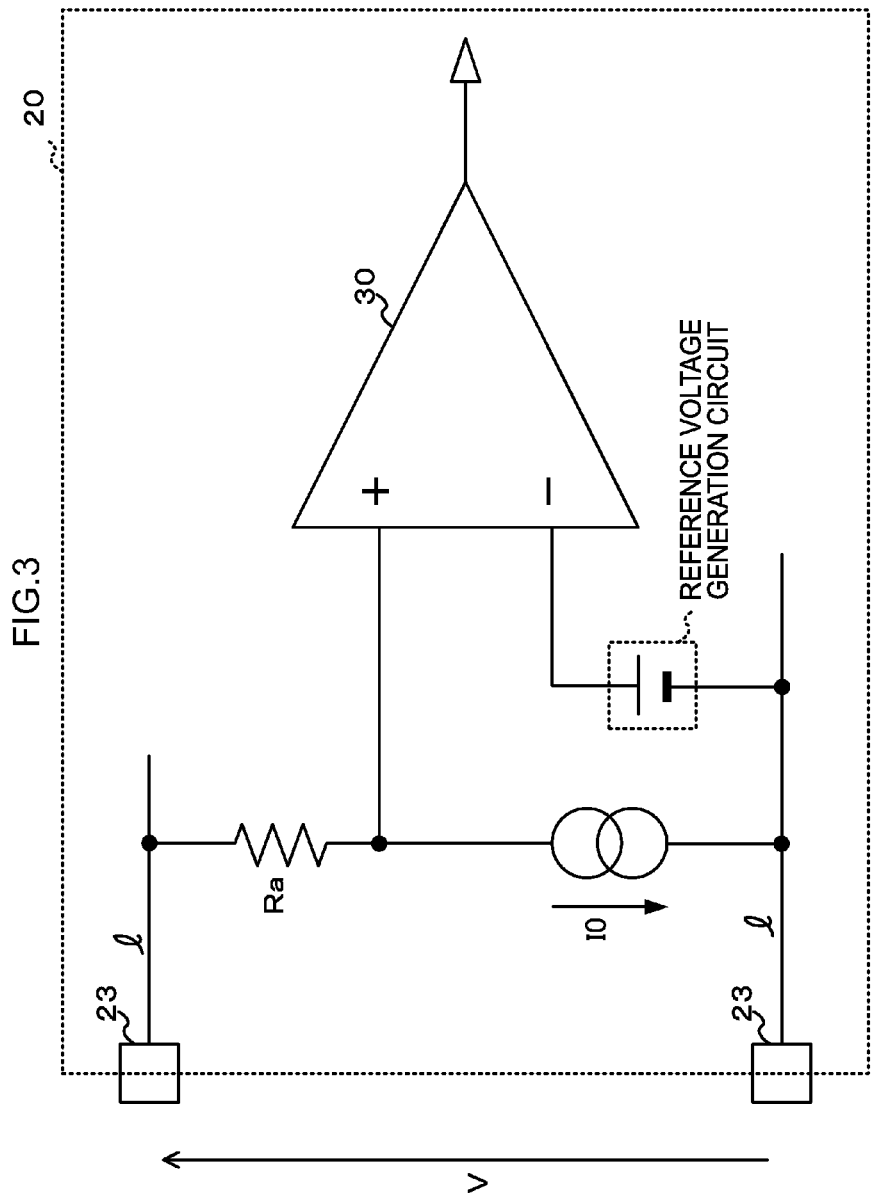
FIG. 3 is a circuit diagram of an example of schematic structure of the voltage detection circuit in accordance with the first exemplary embodiment.

Each voltage detection circuit 20 functions to detect the battery voltage of the respective battery cell C. FIG. 3 shows a circuit diagram of an example of schematic structure of the voltage detection circuit 20 of the present exemplary embodiment.

In the voltage detection circuit 20 of the present exemplary embodiment, a resistor Ra and a constant current source I0 are connected in series across an input voltage V of the voltage detection circuit 20 (between a line 1 connected to the high potential side of the battery cell C and a line 1 connected to the low potential side of the same). The voltage of the connection between the resistor Ra and the constant current source I0 is inputted to the non-inverting terminal of a comparator 30. The inverting terminal of the comparator 30 is connected such that a reference voltage generated by a reference voltage generation circuit is inputted thereto. The comparator 30 outputs a difference between the voltage inputted at the non-inverting terminal and the reference voltage inputted at the inverting terminal Because the constant current I0 from the constant current source I0 flows in the resistor Ra, the voltage inputted to the non-inverting terminal of the comparator 30 is V−I0×Ra. Meanwhile, the reference voltage generated by the reference voltage generation circuit is inputted to the inverting terminal Therefore, by the reference voltage being set in accordance with the constant current I0 and the resistor Ra, the input voltage V (or a voltage corresponding to the input voltage V) can be outputted from the comparator 30.

Figure 4:
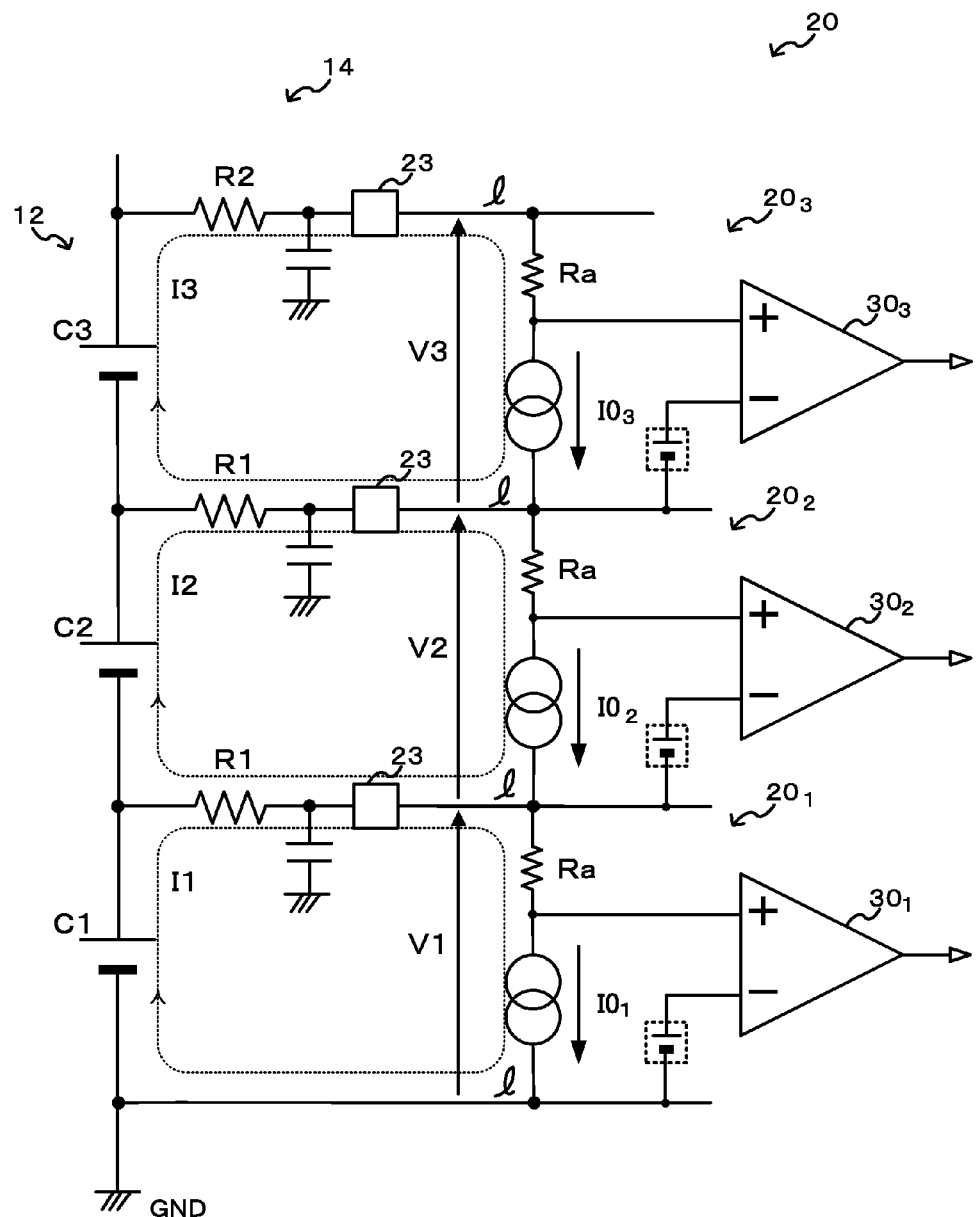
FIG. 4 is a circuit diagram for describing operation of the example of the voltage detection circuit in accordance with the first exemplary embodiment.

Now, a voltage detection operation of the voltage detection circuit 20 according to the present exemplary embodiment is described with reference to FIG. 4. In FIG. 4, as a specific example, a case is illustrated in which the battery cell group 12 is formed with three of the battery cells C and connected such that the battery cell C3 is at the highest potential and the battery cell C1 is at the lowest potential. The voltage detection circuits $20_1$, $20_2$ and $20_3$ shown in FIG. 4 are substantially identical. The resistance values of the resistors Ra ($Ra_1$, $Ra_2$ and $Ra_3$) and the current values of the constant current sources I0 ($I0_1$, $I0_2$ and $I0_3$) are equal, and the reference voltage generation circuits have identical structures.

In FIG. 4, a current flowing in the battery cell C1 is represented by I1 and the input voltage of the voltage detection circuit $20_1$ is represented by V1, a current flowing in the battery cell C2 is represented by I2 and the input voltage of the voltage detection circuit $20_2$ is represented by V2, and a current flowing in the battery cell C3 is represented by I3 and the input voltage of the voltage detection circuit $20_3$ is represented by V3.

Currents flowing in the battery cells C due to the constant current sources $I0_1$, $I0_2$ and $I0_3$ are I1, I2 and I3, which are all equal to the constant current I0 regardless of the battery voltages of the battery cells C.

Therefore, the current values of the current I1 and the current I2 in the resistor R1 of the noise removal filter 14 that is connected between the battery cell C1 and the battery cell C2 are equal to the constant current I0 and flow in opposite directions to one another. Therefore, current I1 and current I2 cancel out, current flowing through the resistor R1 is substantially zero, and there is no voltage drop across the resistor R1. Similarly, in the resistor R1 of the noise removal filter 14 that is connected between the battery cell C2 and the battery cell C3, current flowing through the resistor R1 is substantially at zero and there is no voltage drop across the resistor R1.

Only current I3 (a current in one direction) flows in the resistor R2 of the noise removal filter 14 that is connected at the high potential side of the battery cell C3. Therefore, there is a voltage drop across the resistor R2, and there is a difference between the battery voltage of the battery cell C3 and the input voltage V3. Accordingly, the present exemplary embodiment has a structure in which the resistance value of the resistor R2 is made smaller (at least, smaller than the resistors R1) and the effect of the difference is moderated.

Thus, according to the present exemplary embodiment, the resistor Ra and constant current source I0 are connected in series between the line 1 connected to the high potential side of the respective battery cell C and the line 1 connected to the low potential side, and the voltage of the junction between the resistor Ra and the constant current source I0 is inputted to the non-inverting terminal of the comparator 30. Thus, the voltage inputted to each comparator 30 is generated by constant current consumption (the constant current source I0) with no dependence on the battery voltage of the battery cell C. Therefore, a current flowing in the battery cell C is always at the constant current I0.

Thus, in the resistors R1, the constant currents I0 flow in mutually opposite directions and cancel out, and the currents are substantially at zero. Consequently, voltage drops across the resistors R1 do not occur and there are no differences between the input voltages V of the voltage detection circuits 20 and the battery voltages of the battery cells C. As mentioned above, the input voltage V is outputted from the comparator 30. Thus, because this difference does not occur in the present exemplary embodiment, the battery voltage of each battery cell C is accurately outputted from the corresponding comparator 30. Therefore, even if a battery voltage of the battery cells C (C1, C2 or C3) is inconsistent, the battery voltages of the battery cells C may be accurately detected.

—Second Exemplary Embodiment—

Herebelow, a voltage detection circuit according to a second exemplary embodiment of the present invention is described with reference to the drawings. The present exemplary embodiment features structures and operations that are substantially the same as in the voltage detection circuit 20 of the first exemplary embodiment. Accordingly, portions that are substantially the same are only recited in gist and are not described in detail.

Figure 5:
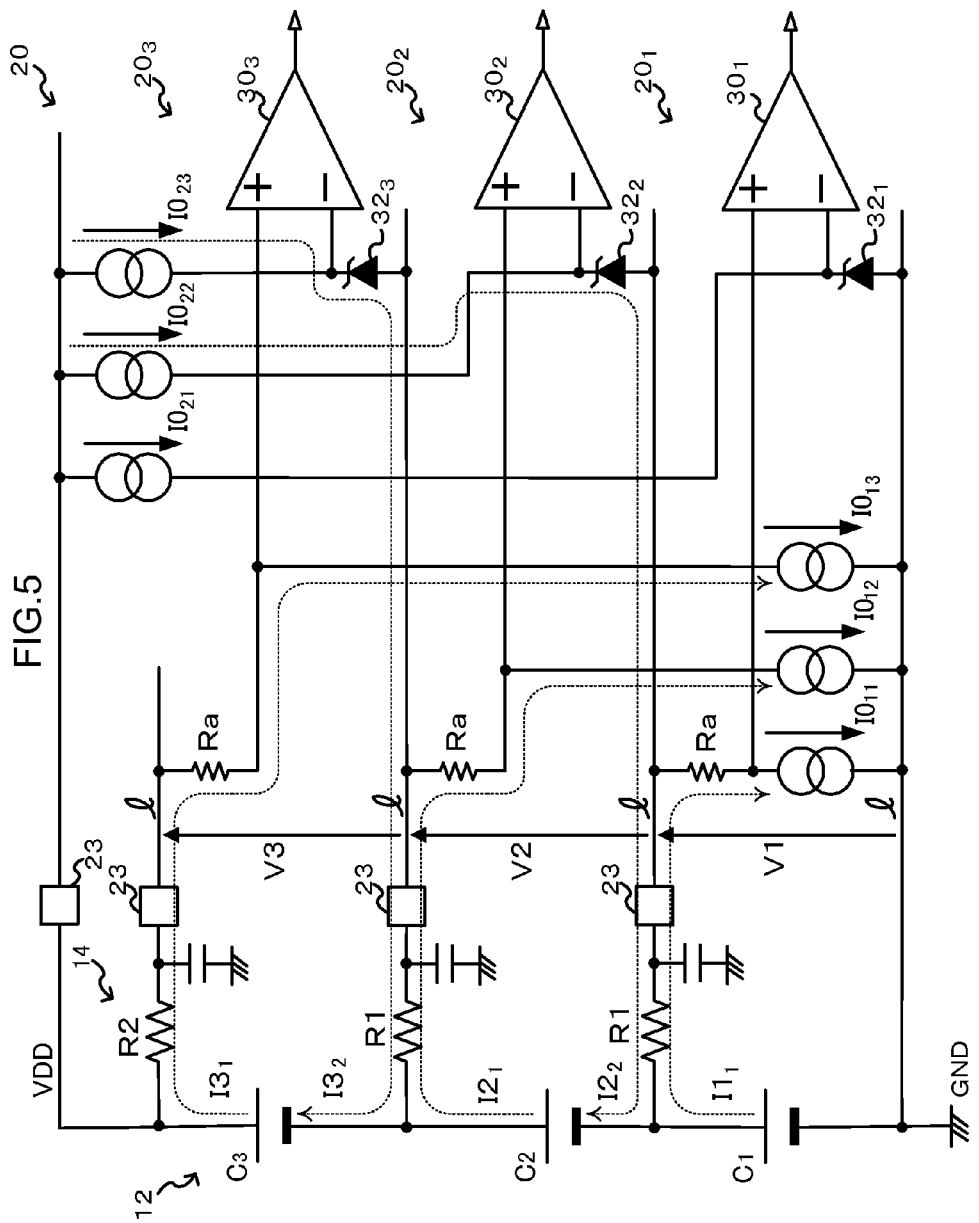
FIG. 5 is a circuit diagram for describing operation of an example of a voltage detection circuit in accordance with a second exemplary embodiment.
Figure 6:
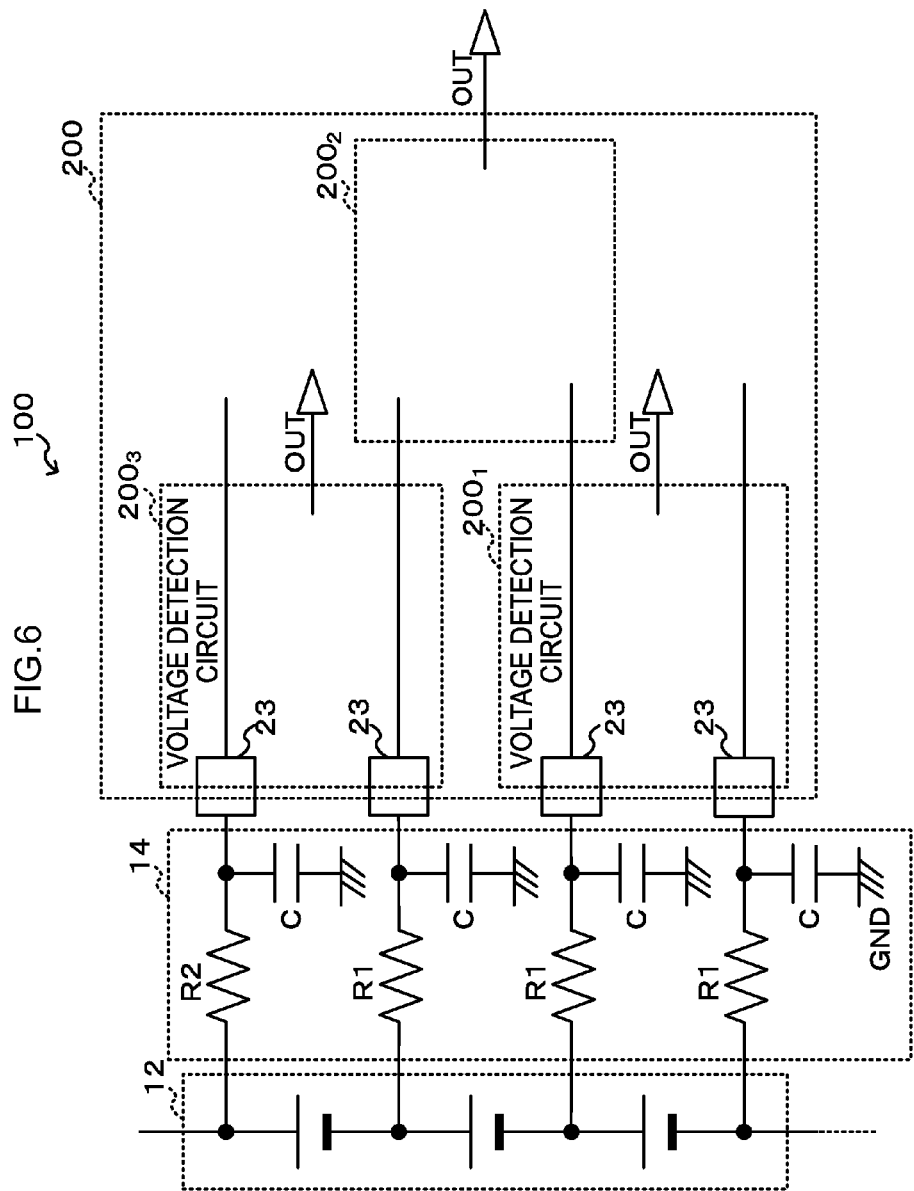
FIG. 6 is a schematic diagram showing relationships between voltage detection circuits and a battery cell group in related art.
Figure 7:
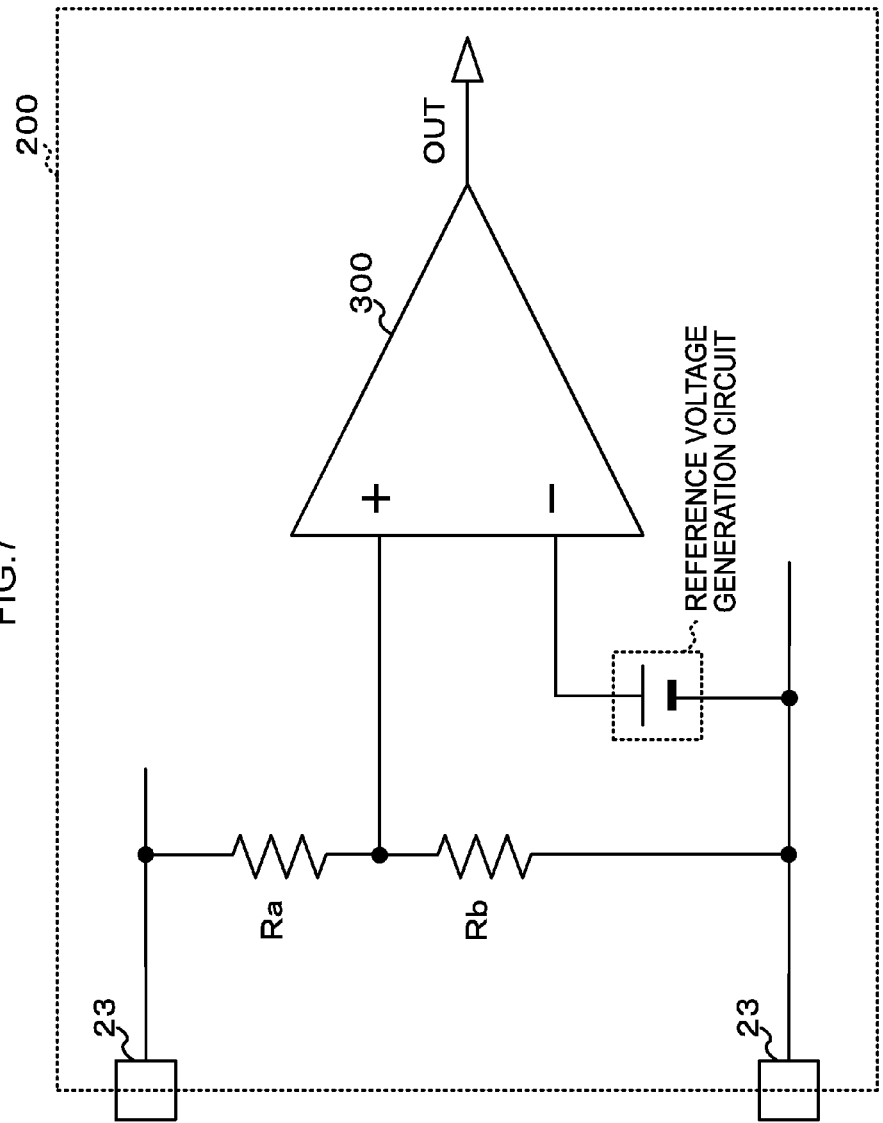
FIG. 7 is a circuit diagram of an example of schematic structure of the related art voltage detection circuit.
Figure 8:
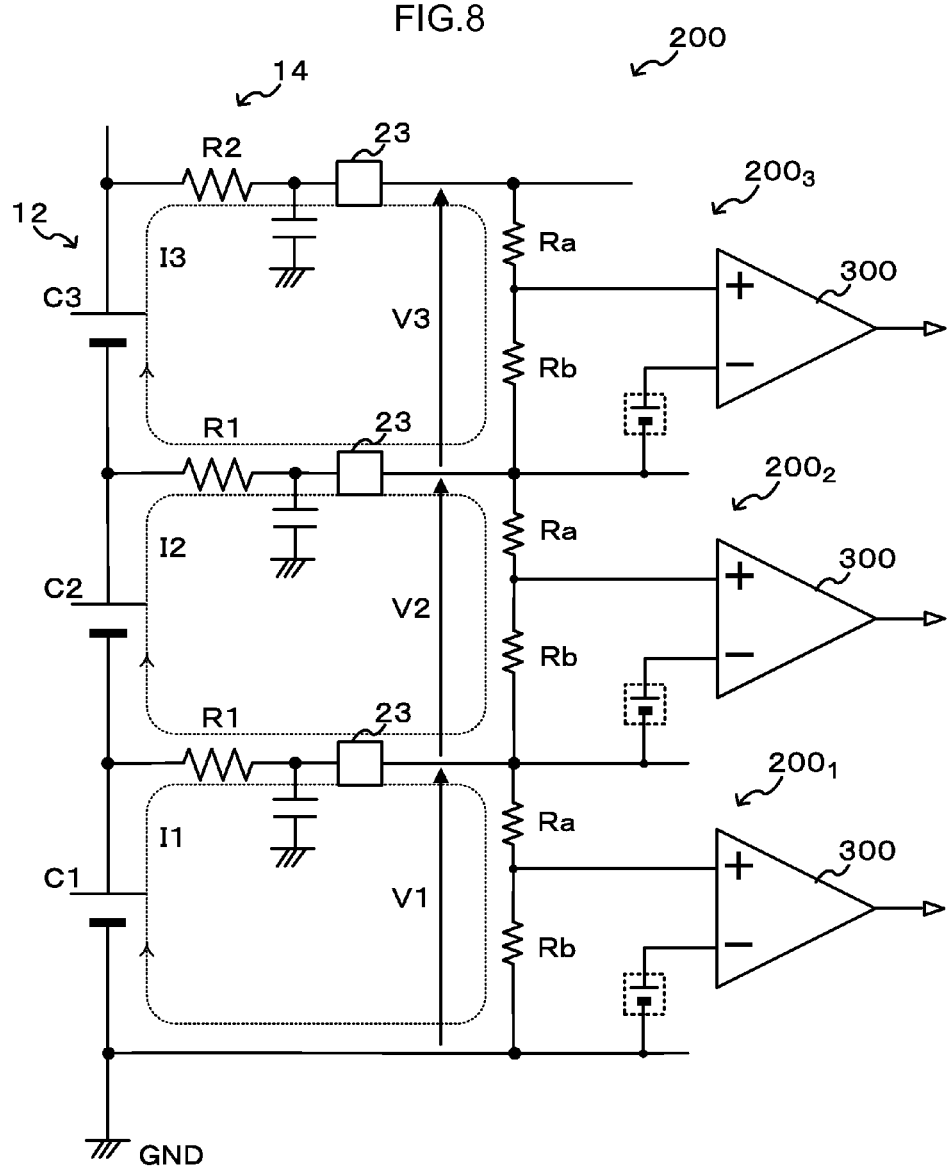
FIG. 8 is a circuit diagram for describing operation of an example of the related art voltage detection circuit.

FIG. 5 shows a circuit diagram of an example of schematic structure of the voltage detection circuit 20 in accordance with the present exemplary embodiment. In the voltage detection circuit 20 of the present exemplary embodiment, constant current sources $I0_{11}$, $I0_{12}$ and $I0_{13}$ correspond to the constant current sources I0 that are connected in series with the resistors Ra in the first exemplary embodiment. Other ends of the constant current sources $I0_{11}$, $I0_{12}$ and $I0_{13}$ are connected to ground (GND). Therefore, the constant current sources $I0_{11}$, $I0_{12}$ and $I0_{13}$ generate constant currents by reference to the ground potential GND.

In the present exemplary embodiment, in place of the reference voltage generation circuits of the first exemplary embodiment, generation sources of the reference voltages that are inputted to the inverting terminals of the comparators $30_1$, $30_2$ and $30_3$ are constant current sources $I0_{21}$, $I0_{22}$ and $I0_{23}$ and Zener diodes $32_1$, $32_2$ and $32_3$, which are connected to a power supply line VDD that supplies a power supply voltage VDD.

In the present exemplary embodiment, the Zener diodes 32 are used in correspondence with the resistors Ra. Accordingly, the input voltages V (or voltages corresponding to the input voltages V) are outputted from the comparators 30.

A current $I1_1$ flowing from the battery cell C1 to the resistor R1 of the noise removal filter 14 that is connected between the battery cell C1 and the battery cell C2 is $I1_1$ equal to the constant current $I0_{11}$ due to the constant current source $I0_{11}$. A current $I2_2$ generated flowing through the Zener diode $32_2$ from the constant current source $I0_{22}$ and flowing to the battery cell C2 is $I2_2$ equal to the constant current $I0_{22}$ due to the constant current source $I0_{22}$. Similarly, a current $I2_1$ flowing from the battery cell C2 to the resistor R1 of the noise removal filter 14 that is connected between the battery cell C2 and the battery cell C3 is $I2_1$ equal to the constant current $I0_{12}$ due to the constant current source $I0_{12}$. A current $I3_2$ generated flowing through the Zener diode $32_3$ from the constant current source $I0_{23}$ and flowing into the battery cell C3 is $I3_2$ equal to the constant current $I0_{23}$ due to the constant current source $I0_{23}$.

If the current values of the constant current sources $I0_{11}$, $I0_{12}$ and $I0_{13}$ and the constant current sources $I0_{21}$, $I0_{22}$ and $I0_{23}$ are all equal (the constant current I0), then $I1_1$, $I2_1$, $I2_2$ and $I3_2$ are all equal at the constant current I0, regardless of the battery voltages of the battery cells C (C1, C2 and C3).

Thus, the current values of current $I1_1$ and current $I2_2$ in the resistor R1 of the noise removal filter 14 that is connected between the battery cell C1 and the battery cell C2 are equal, being the constant current I0, and the directions of flow are opposite. Therefore, current $I1_1$ and current $I2_2$ cancel out, current flowing through the resistor R1 is substantially zero, and there is no voltage drop across the resistor R1. Similarly, the current values of current $I2_1$ and current $I3_2$ in the resistor R1 of the noise removal filter 14 that is connected between the battery cell C2 and the battery cell C3 are equal at the constant current I0, and the directions of flow are opposite. Therefore, current $I2_1$ and current $I3_2$ cancel out, current flowing through this resistor R1 is substantially zero, and there is no voltage drop across the resistor R1.

Now, consider a case in which only either the constant current sources $I0_1$ or the constant current sources $I0_2$ are provided; for example, a case in which only the constant current sources $I0_1$ are provided. This mode corresponds to the conventional technology recited in the above-mentioned Japanese Patent Application Laid-Open (JP-A) No. 2010-281805. In this case, the currents flowing out from the battery cells C ($I1_1$, $I2_1$ and $I3_1$) are all at the constant current I0, and are all equal. However, the currents flowing from the comparators 30 (from the reference voltage generation sources) to the battery cells C ($I2_2$ and $I3_2$) are not constant but vary in accordance with the battery voltages of the battery cells C. Therefore, the currents flowing through the resistors R1 do not cancel out and do not go substantially to zero, and there may be voltage drops across the resistors R1. Similarly, in a case in which only the constant current sources $I0_2$ are provided, the currents flowing through the resistors R1 do not cancel out and do not go substantially to zero, and there may be voltage drops across the resistors R1. Thus, currents flowing through the resistors R1 may cancel out and go substantially to zero, and voltage drops across the resistors R1 may be avoided by both the constant current sources $I0_1$ and the constant current sources $I0_2$ being provided as in the present exemplary embodiment.

According to this present exemplary embodiment, the battery monitoring system is structured such that each resistor Ra and constant current source $I0_1$ are connected in series between the high potential side line 1 of the respective battery cell C and ground GND, and the voltage of the junction between the resistor Ra and the constant current source $I0_1$ is inputted to the non-inverting terminal of the comparator 30. Furthermore, the battery monitoring system is structured that each constant current source $I0_2$ and Zener diode 32 are connected in series between the power supply line VDD and the low potential side line 1 of the battery cell C, and the reference voltage generated by the constant current I0 and the Zener diode 32 is inputted to the inverting terminal of the comparator 30. The constant currents provided by the constant current sources $I0_1$ and the constant current sources $I0_2$ are all equal (the constant current I0).

Thus, the voltages inputted to the comparators 30 and the reference voltages are generated by constant current consumption (the constant current sources I0) with no dependence on the battery voltages of the battery cells C. Therefore, the currents flowing to the battery cells C and the currents flowing from the battery cells C are always at the constant current I0. Thus, in the resistors R1, the constant currents I0 flow in mutually opposite directions and cancel out, and the currents are substantially at zero. Consequently, voltage drops across the resistors R1 do not occur and there are no differences between the input voltages V of the voltage detection circuits 20 and the battery voltages of the battery cells C. Therefore, even if a battery voltage of the batteries C (C1, C2 or C3) is inconsistent, the battery voltages of the battery cells C may be detected accurately.

In the present exemplary embodiment, the constant current sources $I0_1$ all generate the constant current I0 by reference to the ground potential (GND), and the constant current sources $I0_2$ all generate the constant current I0 by reference to the potential of the power supply voltage (VDD).

Therefore, a constant current source $I0_1$ and a constant current source $I0_2$ that are shared by the battery cells C may be used. For example, if a constant current source is provided separately in the semiconductor device 16, constant currents I0 generated by this constant current source may be utilized. In contrast, in the first exemplary embodiment, because each constant current source I0 generates the constant current I0 by reference to the potential of the lower potential side of the respective battery cell C, a constant current source I0 is needed for each of these potentials, which is to say, for each of the battery cells C. Therefore, the present exemplary embodiment provides an effect in that circuit size may be reduced.

In the present exemplary embodiment, the Zener diodes 32 are used as reference voltage sources for the comparators 30, but this is not a limitation. Diodes and resistors may be used, and resistors alone may be used.

In the exemplary embodiments described above, each resistor Ra is connected to the positive terminal (higher potential) of the battery cell C, and the reference voltage of the comparator is connected to the negative terminal (lower potential) of the battery cell C. However, this is not a limitation and the two may be arranged the other way round.

In the exemplary embodiments described above, the MCU 22 is provided inside the semiconductor device 16 together with the voltage detection circuits 20, but this is not a limitation. The MCU 22 may be formed in a separate circuit (chip). Furthermore, the noise removal filter 14 is provided outside the semiconductor device 16 but this is not a limitation, and the noise removal filter 14 may be formed in the same circuit (chip).

In the exemplary embodiments described above, cases are described in which the voltage detection circuits 20 are provided one for each battery cell C of the battery cell group 12, but this is not a limitation. For example, a single voltage detection circuit 20 may be provided for the battery cell group 12, and a battery cell C whose battery voltage is to be detected may be connected with this voltage detection circuit 20 by suitable switching elements or the like.

It will be clear to those skilled in the art that the structures, operations and the like of the battery monitoring system 10, semiconductor device 16, voltage detection circuit 20 and so forth described in the above exemplary embodiments are examples and may be suitably modified in accordance with circumstances within a scope not departing from the spirit of the present invention.

What is claimed is:

1. A semiconductor device comprising:
   external terminals, each of the external terminals is connected to a terminal of a resistor element, wherein another terminal of the resistor element is connected to a connection portion of respective neighboring battery cells of a plurality of battery cells connected in series;
   a plurality of lines connected to the external terminals;
   a plurality of voltage detection portions, each of the plurality of voltage detection portions is set to correspond to each of the plurality of battery cells, respectively, each of the plurality of voltage detection portions detects a battery voltage value of the battery cell in accordance with a voltage provided by the line that is connected to the high potential side of the battery cell and the line that is connected to the low potential side of the battery cell; and a plurality of regulation portions, at each of the plurality of lines, the plurality of regulation portions are set to correspond to each of the plurality of battery cells, respectively, a terminal of a regulation portion of the plurality of regulation portions is connected to a line that is connected to the high potential side of the battery cell, and another terminal of the regulation portion is connected to a line that is connected to the low potential side of the battery cell, and each regulation portion being connected in series, each of the plurality of regulation portions comprises a constant current source, the constant current source generates current to make a first current and a second current cancel out, the first current being caused to flow in a first direction in the resistor element by the battery cell in the line that is connected to the high potential side of the battery cell, and the second current being caused to flow in a second direction in the resistor element by another battery cell in the line that is connected to the low potential side of the battery cell.

2. The semiconductor device according to claim 1, wherein:

the regulation portion comprises:
  a first constant current source that generates a constant current by reference to a ground potential; and
  a second constant current source that generates a constant current by reference to a power supply potential, and the voltage detection portion comprises:
  a resistor and the first constant current source, which are connected in series between the line connected to the high potential side of the each battery cell and ground;
  a reference voltage generation portion that is connected in series with the second constant current source between a power supply line and the line connected to the low potential side of each battery cell, and that generates a reference voltage from the constant current of the second constant current source; and
  a comparison circuit that outputs a difference between the voltage of a junction between the resistor and first constant current source that are connected in series and the reference voltage.

3. The semiconductor device according to claim 2, wherein the reference voltage generation portion comprises a Zener diode, a resistor element, or both a resistor element and a diode.

4. The semiconductor device of claim 1, wherein the voltage detection portion comprises:
  a resistor and the constant current source, which are connected in series between the line connected to the high potential side of the each battery cell and the line connected to the low potential side of the each battery cell, and
  a comparison circuit that outputs a difference between the voltage of a junction between the resistor and constant current source that are connected in series and a predetermined reference voltage.

5. A battery monitoring system comprising:
a plurality of battery cells connected in series;
a noise removal portion comprising resistor elements and capacitor elements connected to high potential sides of the plurality of battery cells;
a plurality of lines connected, via the resistor elements of the noise removal portion, to lines between respective neighboring battery cells of the plurality of battery cells;
a plurality of voltage detection portions, each of the plurality of voltage detection portions is set to correspond to each of the plurality of battery cells, respectively, each of the plurality of voltage detection portions capable of detecting a battery voltage value of the battery cell in accordance with a voltage provided by the line that is connected to the high potential side of the battery cell and the line that is connected to the low potential side of the battery cell; and
a regulation portion at the plurality of lines, a terminal of the regulation portion is connected to a line that is connected to the high potential side of the battery cell, and another terminal of the regulation portion is connected to a line that is connected to the low potential side of the battery cell, the regulation portion configured to generate current to make a first current and a second current cancel out, the first current being caused to flow in a first direction in the resistor element by the battery cell in the line that is connected to the high potential side of the battery cell, and the second current being caused to flow in a second direction in the resistor element by another battery cell in the line that is connected to the low potential side of the battery cell, regardless of variations in battery voltages of the plurality of battery cells, wherein:
  the regulation portion comprises a constant current source and is set to correspond to each of the plurality of battery cells, respectively, each regulation portion being connected in series.

6. The battery monitoring system of claim 5, wherein the voltage detection portion comprises:
  a resistor and the constant current source, which are connected in series between the line connected to the high potential side of the each battery cell and the line connected to the low potential side of the each battery cell, and
  a comparison circuit that outputs a difference between the voltage of a junction between the resistor and constant current source that are connected in series and a predetermined reference voltage.

* * * * *